United States Patent
Sakoda et al.

(10) Patent No.: US 6,670,221 B2
(45) Date of Patent: Dec. 30, 2003

(54) SEMICONDUCTOR DEVICE HAVING A BUILT-IN CONTACT-TYPE SENSOR AND MANUFACTURING METHOD THEREOF

(75) Inventors: Hideharu Sakoda, Kawasaki (JP); Fumihiko Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/262,890

(22) Filed: Oct. 3, 2002

(65) Prior Publication Data

US 2003/0178714 A1 Sep. 25, 2003

(30) Foreign Application Priority Data

Mar. 20, 2002 (JP) ........................................ 2002-079246

(51) Int. Cl.[7] .............................................. H01L 24/44
(52) U.S. Cl. ...................... 438/112; 438/784; 438/127; 438/239; 257/680; 257/48; 257/257; 257/252; 257/59; 257/72; 382/124; 382/312; 382/116
(58) Field of Search ................. 438/784, 127, 438/112, 239; 257/680, 48, 257, 252, 59, 72; 382/124, 312, 116

(56) References Cited

U.S. PATENT DOCUMENTS 5,862,248 A * 1/1999 Salatino et al. ............. 382/124
6,088,471 A * 7/2000 Setlak et al. ................ 382/124
6,330,145 B1 * 12/2001 Lepert et al. ............... 361/220
6,512,381 B2 * 1/2003 Kramer ...................... 324/658
2002/0109137 A1 * 8/2002 Sato et al. ..................... 257/48
2002/0117694 A1 * 8/2002 Migliorato et al. ......... 257/253

* cited by examiner

Primary Examiner—Matthew Smith
Assistant Examiner—V. Yevsikov
(74) Attorney, Agent, or Firm—Westerman, Hattori & Daniels Adrian, LLP

(57) ABSTRACT

In a semiconductor device having a built-in contact-type sensor, a height of a surrounding part of a sensor part from the exposed surface of the sensor part is reduced. The semiconductor device has a semiconductor element having a built-in sensor. The semiconductor element has a circuit forming surface and a back surface opposite to the circuit forming surface. The contact-type sensor and electrodes are formed on the circuit forming surface. Back electrodes are formed on the back surface. Conductive members extend through the semiconductor device from the electrodes to the back electrodes. A protective film covers the circuit forming surface in a state where the surface of the contact-type sensor is exposed. External connection terminals are electrically connected to the back electrodes.

10 Claims, 6 Drawing Sheets

SEMICONDUCTOR DEVICE HAVING A BUILT-IN CONTACT-TYPE SENSOR AND MANUFACTURING METHOD THEREOF

BACKGROUND OF THE INVENTION

1. Field of the Invention

The present invention generally relates to semiconductor devices having a built-in contact-type sensor and, more particularly, to a semiconductor device packaged with a built-in contact-type sensor element being exposed on a surface thereof.

Along with the popularization of electronic information communication, a demand of performing individual recognition in electronic equipments is increasing so as to protect the confidentiality of personal information. Various techniques have been developed as individual recognition means, and, among them, a fingerprint distinguishing technique has attracted attention. A semiconductor device into which a contact-type sensor using electrostatic capacity is incorporated has been developed as a small device used for distinguishing a fingerprint.

2. Description of the Related Art

Generally, a fingerprint sensor referred to as a capacitance-type recognizes a fingerprint by having a fingertip directly contact a sensor surface. A fingerprint sensor referred to as a sweep-type reads a fingerprint image by sweeping a sensor surface with a finger. The sweep-type fingerprint sensor is capable of recognizing a fingerprint image by sweeping with a finger even a small width for example, about 1 mm. Accordingly, the sweep-type has become popular as a fingerprint sensor to be incorporated into portable equipment.

The electrostatic-capacity sensor used as a fingerprint sensor can be formed on a silicon substrate like a semiconductor device. That is, a fingerprint sensor can be manufactured as a part of a semiconductor chip made by a silicon substrate.

FIG. 1 is a cross-sectional view of a conventional sweep-type fingerprint sensor apparatus 1. A semiconductor chip 3 in which a sensor part 2 as a fingerprint sensor is formed is mounted on a package substrate 5 through a die bonding material 4. The sensor part 2 is exposed in a part of a circuit forming surface 3a of the semiconductor chip 3. An electrode pad 6 is formed on the circuit forming surface 3a, and pads 9 that are electrically connected to the external connection terminals (solder balls) 7 are formed on the package substrate 5. Electrode pads 6 of the semiconductor chip 3 are wire-bonded to the pads 9 of the package substrate 5 by gold wires 10. The semiconductor chip 3 and the gold wires 10 are encapsulated by a seal resin 11 on the package substrate 5.

In the fingerprint sensor apparatus 1 of the above-mentioned structure, the sensor part 2 of the semiconductor chip 3 is a part onto which a finger is contacted directly, and, thus, the sensor part 2 must be exposed on the front surface of the fingerprint sensor apparatus 1. For this reason, the encapsulation of the semiconductor chip 3 is carried out so that the sensor part 2 is not covered by the seal resin 11. However, the electrode pads 6 are provided on the circuit forming surface 3a of the semiconductor chip 3 and the gold wires 10 are connected to the electrode pads 6, such a portion must be encapsulated by the seal resin 11. Therefore, in parts other than the part in which the sensor part 2 is exposed, a certain thickness is required for the seal resin 11 so as to cover the gold wires 10. That is, a certain height is needed from the exposed surface of the sensor part 2.

As mentioned above, the sensor part 2 is a part which is contacted directly by a finger, and, thus, it may become impossible to contact a finger completely if the surrounding part of the exposed part is high. In the case of a sweep-type fingerprint-sensor apparatus, since a width (in a direction X of FIG. 1) of the sensor part 2 is as small as about 1 mm, a finger may not completely contact if the surrounding part is high.

SUMMARY OF THE INVENTION

It is a general object of the present invention to provide an improved and useful semiconductor device having a built-in contact-type sensor in which the above-mentioned problems are eliminated.

A more specific object of the present invention is to provide a semiconductor device having a built-in contact-type sensor in which a height of a surrounding part of a sensor part from the exposed surface of the sensor part is reduced.

In order to achieve the above-mentioned object, there is provided according to the present invention a semiconductor device having a built-in contact-type sensor, comprising: a semiconductor element having a built-in sensor, the semiconductor element having a circuit forming surface and a back surface opposite to the circuit forming surface, the contact-type sensor and electrodes formed on the circuit forming surface, back electrodes formed on the back surface; conductive members extending through the semiconductor device from the electrodes to the back electrodes; a protective film covering the circuit forming surface in a state where a surface of the contact-type sensor is exposed; and external connection terminals electrically connected to the back electrodes.

According to the above-mentioned invention, the protective film covering the circuit forming surface cay be made very thin since there is no protruding part such as a bonding wire on the circuit forming surface. Thus, a height of a part surrounding a part where the contact-type sensor is exposed can be reduced. Thereby, a reliable contact on the exposed surface of the contact-type sensor can be made, which results in a reliable detection of the contact-type sensor.

In the semiconductor device according to the present invention, the conductive members may be formed by a conductive material filled in through holes. Accordingly, the electrodes on the side of the circuit forming surface can be easily connected to the back electrode on the side of the back surface by utilizing the through holes.

Additionally, an insulating protective film may be formed on the back surface of the semiconductor element, and the back electrode and the external connection terminals may be electrically connected to each other through patterned wires formed on the insulating protective film. Accordingly, the external connection terminals can be located at any positions by providing the patterned wires.

The semiconductor device according to the present invention may further comprise a semiconductor element for control which provides a function related to a sensor function of the semiconductor element having the built-in sensor, wherein the control semiconductor element for control being situated on a backside of the semiconductor element having the built-in sensor. Accordingly, the semiconductor element having the built-in sensor can be used exclusively for a sensor function, and a semiconductor element for controlling the sensor function can be separately produced. Thus, the semiconductor elements having each function can be effectively produced. Additionally, a projected area of the semiconductor elements can be reduced by providing the semiconductor elements for control under the semiconductor element having the built-in sensor.

In the semiconductor device according to the present invention, a plurality of the semiconductor elements may be provided which include the semiconductor elements for control which controls the sensor function of the semiconductor element having the built-in sensor and a semiconductor element for memory which stores data related to the sensor function. Accordingly, the semiconductor element for control can be produced separately as a semiconductor element for logic operations and a semiconductor element exclusive for memory. Thus, the semiconductor elements having each function can be efficiently produced. Additionally, a projected area of the semiconductor elements can be reduced by providing the semiconductor elements for control under the semiconductor element having the built-in sensor in a stacked state.

Additionally, the semiconductor element having the built-in sensor may be encapsulated in a state where the semiconductor element is mounted on the package substrate via the back electrodes so that the semiconductor device is formed as a ball grid array type semiconductor device. Accordingly, the ball grid array type semiconductor device having a built-in sensor can be easily produced by using the back electrodes.

Further, the semiconductor element having the built-in sensor may be encapsulated in a state where the semiconductor element is mounted on a lead frame, and the back electrodes may be electrically connected by bonding wires to lead terminals as the external connection terminals. Accordingly, the lead terminal type semiconductor device having a built-in sensor can be easily produced by using the back electrodes.

Additionally, in the semiconductor device according to the present invention, the contact-type sensor may be a fingerprint sensor of an electrostatic capacitance type. Accordingly, in the sweep-type fingerprint sensor in which a finger is moved while being brought into the sensor surface, a sweep operation of the finger can be reliably performed since a part surrounding the sensor surface is low, thereby reliable fingerprint detection or recognition can be carried out.

Additionally, there is provided according to another aspect of the present invention a manufacturing method of a semiconductor device having a built-in contact sensor, comprising the steps of: preparing a semiconductor element having a built-in sensor, the semiconductor element having a circuit forming surface and a back surface opposite to the circuit forming surface, the contact-type sensor and electrodes formed on the circuit forming surface; forming back electrodes on the back surface of the semiconductor element having the built-in sensor and forming through holes extending through the semiconductor element having the built-in sensor from the electrodes to the back electrodes; electrically connecting the electrodes to the back electrodes by filling a conductive material in the through holes; covering the circuit forming surface by a protective film in a state where a surface of the contact-type sensor is exposed; and forming external connection terminals on the back surface side so as to electrically connect the external connection terminals to the back electrodes.

According to the above-mentioned invention, the protective film covering the circuit forming surface cay be made very thin since there is no protruding part such as a bonding wire on the circuit forming surface. Thus, a height of a part surrounding a part where the contact-type sensor is exposed can be reduced. Thereby, a reliable contact on the exposed surface of the contact-type sensor can be made, which results in a reliable detection of the contact-type sensor.

The manufacturing method may further comprise the steps of: forming an insulating protective film on the back surface of the semiconductor element having the built-in sensor; forming patterned wires on the insulating protective film; and forming the external connection terminals at predetermined positions of the patterned wires. Accordingly, the external connection terminals can be located at any positions by providing the patterned wires.

Other objects, features and advantages of the present invention may become more apparent from the following detailed description when read in conjunction with the accompanying drawings.

DETAILED DESCRIPTION OF THE PREFERRED EMBODIMENTS

A description will now be given, with reference to FIG. 2, of a first embodiment according to the present invention.

Figure 1:
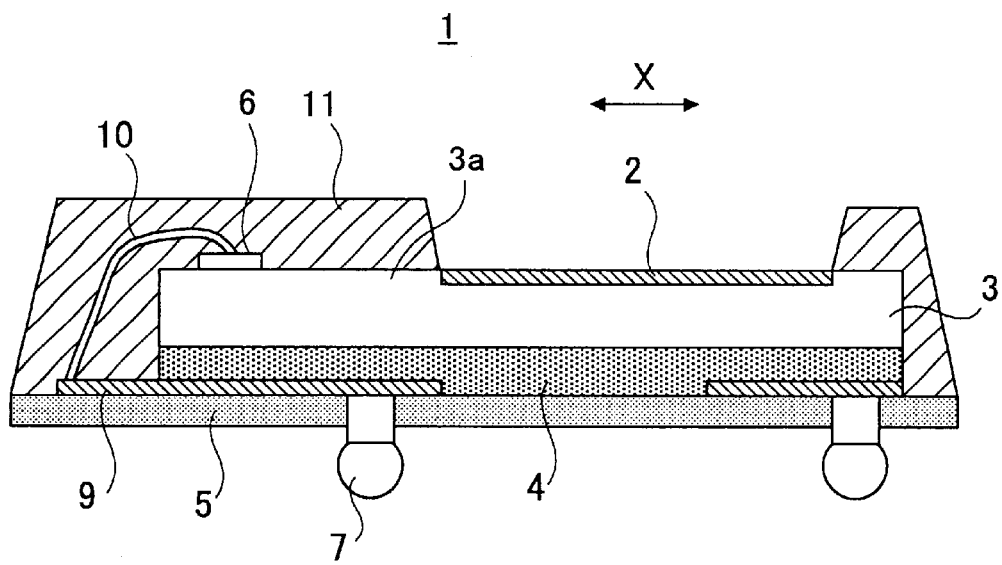
FIG. 1 is a cross-sectional view of a conventional sweep-type fingerprint sensor apparatus.
Figure 2:
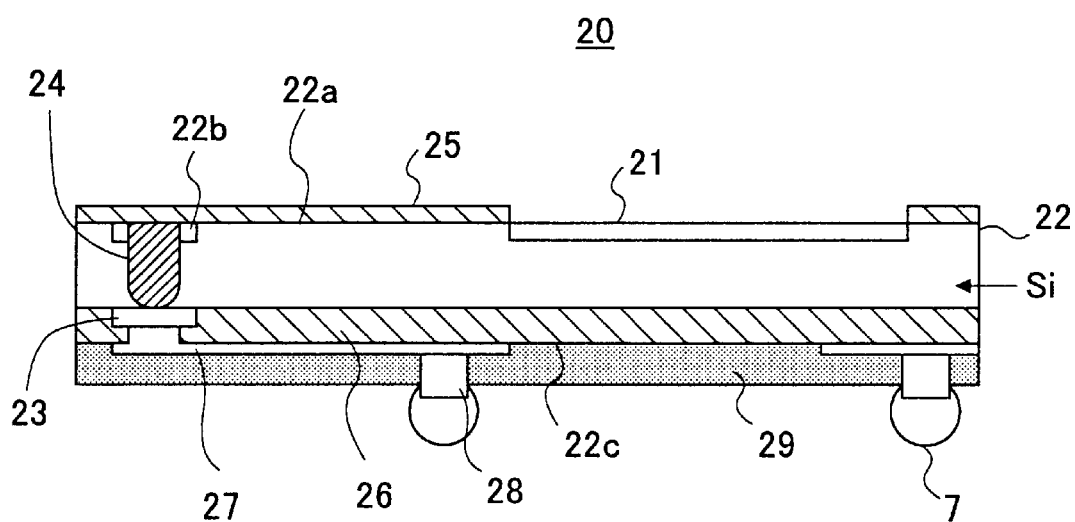
FIG. 2 is a cross-sectional view of a semiconductor device having a built-in fingerprint sensor according to a first embodiment of the present invention.

FIG. 2 is a cross-sectional view of a semiconductor device 20 having a built-in sensor according to the first embodiment of the present invention. The semiconductor device 20 shown in FIG. 2 is formed by packaging a semiconductor chip 22 having a sweep-type fingerprint sensor 21 (built-in sensor) and forming solder balls 7 (external connection terminals) on the package.

The fingerprint sensor 21 is formed on a circuit forming surface 22a of the semiconductor chip 22 that is formed of a silicon wafer. A circuit for attaining the function of the fingerprint sensor 21 is formed on the circuit forming surface 22a, and also electrodes 22b are formed for signal input/output and power supply to the circuit. Although the bonding wires are conventionally connected to the electrodes 22b, in the present embodiment, the bonding wires are not used but the electrodes 22b are led to a back surface 22c of the semiconductor chip 22 by through vias.

That is, in the present embodiment, back electrodes 23 are formed at the locations on the back surface 22c corresponding to the electrodes 22b formed on the circuit forming surface 22a. Then, the through vias 24 formed of a conductive member is provided between the electrodes 22b and the corresponding back electrodes 23, and the electrode 22b and the back electrodes 23 are connected electrically.

Therefore, input/output of signals and also power supply can be carried out through the back electrodes 23 and the through vias. The circuit forming surface 22a of the semiconductor chip 22 is covered by an insulating protective film 25 such as a polyimide film except for a part in which the fingerprint sensor 21 is exposed. Thereby, in the front surface of the semiconductor device 20, only the fingerprint sensor 21 is exposed and other parts are covered by the protective film 25.

Since there is nothing like a bonding wire that protrudes from the circuit forming surface, the protective film 25 can be made very thin. Therefore, the surrounding part of the fingerprint sensor 21 can be made low, and a finger can be certainly contacted to the exposed surface of the fingerprint sensor 21, thereby achieving reliable fingerprint recognition.

The back surface 23c on which the back electrodes 23 are formed is also provided with the insulating protective film 26 like a polyimide film. Then, the patterned wires 27 are formed on the protective film 26, and metal posts 28 are formed on the patterned wires 27. The metal posts 28 are embedded into a heat-resistant resin 29 except for ends thereof, and solder balls 7 are provided on the ends of the metal posts 28 as external connection terminals.

The thus-constructed semiconductor apparatuses 20 having the built-in fingerprint sensor is mounted on a substrate of electronic equipment such as a cellular phone, and is incorporated into the electronic equipment so that the exposed surface of the fingerprint sensor 21 is arranged at an opening formed on a housing of the electronic equipment.

A description will now be given, with reference to FIGS. 3A through 3D, FIGS. 4A through 4D and FIGS. 5A through 5D, of a production process of the semiconductor apparatus 20 with a built-in fingerprint sensor shown in FIG. 2.

Figure 3A:
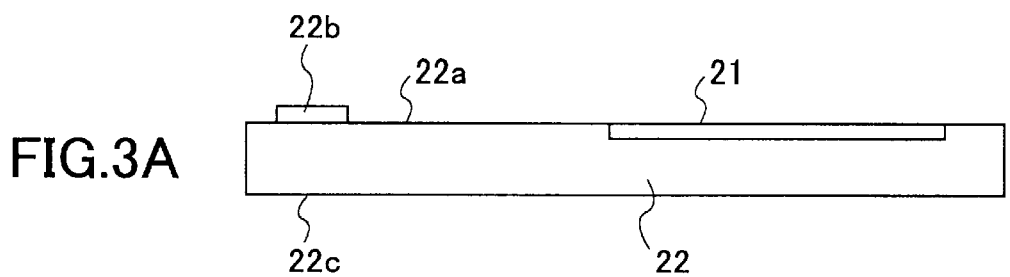
FIGS. 3A through 3D are cross-sectional views of the semiconductor device shown in FIG. 2 in a manufacturing process thereof.
Figure 3B:
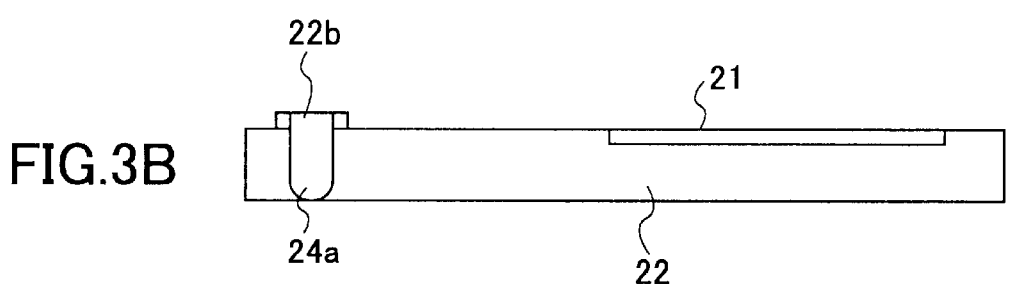

First, as shown in FIG. 3A, the semiconductor chip 22 having the fingerprint sensor 21 is prepared. The electrodes 22b are formed in the circuit forming surface 22a of the semiconductor chip 22. Next, as shown in FIG. 3B, through holes 24a are formed so as to extend from the electrodes 22b. The through holes 24a penetrate electrodes 22b and the semiconductor chip 22, and extend to the back surface 22c of the semiconductor chip 22. The formation of the though holes 24a is carried out by laser beam machining, etching, etc.

Figure 3C:
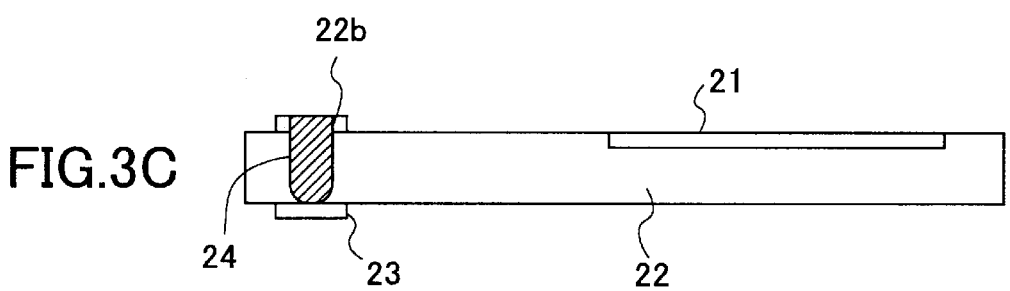

After the through holes 24a are formed, as shown in FIG. 3C, the back electrodes 23 are formed in the parts of the back surface 22 in which the through holes 24a are opened, and the through vias 24 are formed by filling a conductive material in the through holes 24a. A copper plating layer may be deposited inside the through holes 24a by a plating method using copper as a conductive material. A melted solder may be filled in the through holes 24a. Alternatively, a conductive paste such as a solder paste may be filled in the through holes 24a.

According to the above-mentioned process, the electrodes 22b formed on the circuit forming surface are electrically connected with the back electrodes 23 formed in the back surface 22c of the semiconductor chip 22.

Figure 3D:
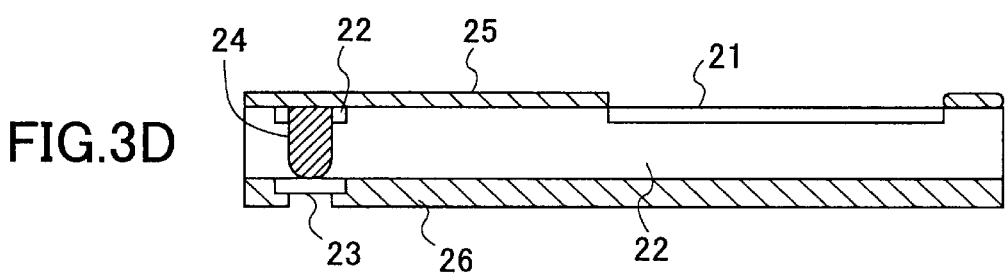

Next, as shown in FIG. 3D, a polyimide resin is applied onto the circuit forming surface of the semiconductor chip 22 and is cured so as to form the protective film 25. At this time, it is treated that the polyimide resin is not applied onto the fingerprint sensor 21 so that the protective film 25 is not formed on the fingerprint sensor 21. Moreover, the polyimide resin is applied also onto the back surface 22c of the semiconductor chip 22 so as to form the protective film 26 on the back surface 22c. At this time, a masking treatment is applied so that the back electrodes 23 are exposed.

Figure 4A:
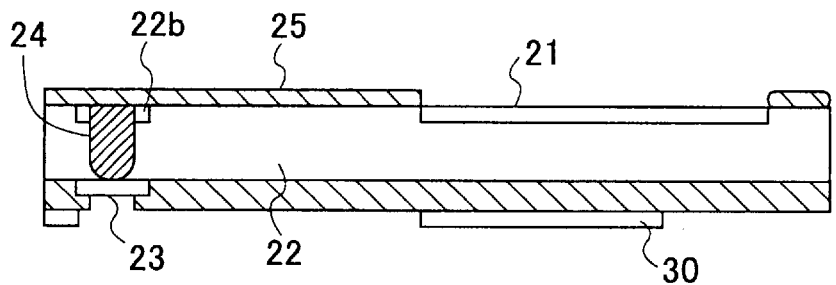
FIGS. 4A through 4D are cross-sectional views of the semiconductor device shown in FIG. 2 in the manufacturing process thereof.
Figure 4B:
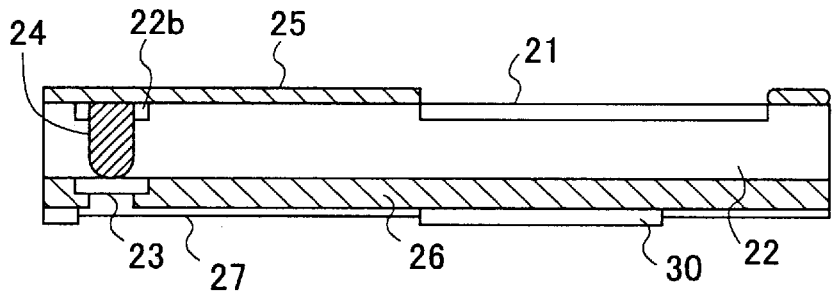
Figure 4C:
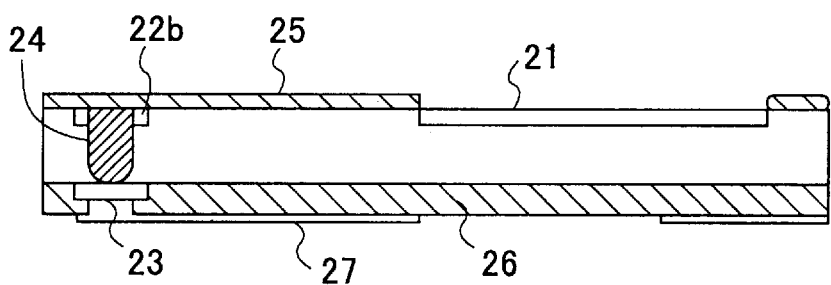
Figure 4D:
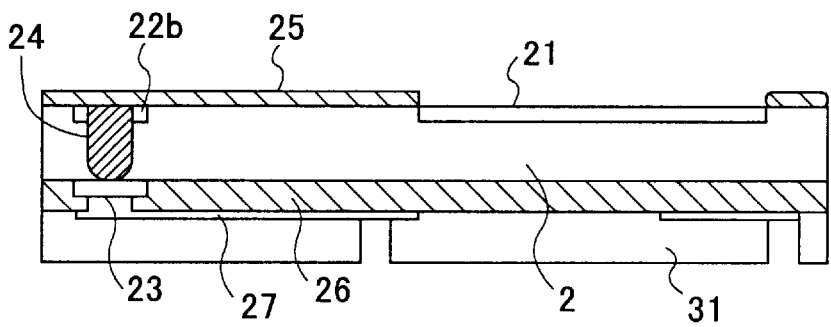

Then, as shown in FIG. 4A, a resist 30 for redistribution wiring is applied onto the protective film 26 and is formed as a configuration corresponding to patterned wires 27, and the patterned wires 27 (redistribution wires) are formed by copper plating or the like as shown in FIG. 4B. Then, the patterned wires 27 are formed on the protective film 26 by removing the resist 30, as shown in FIG. 4C. Thereafter, as shown in FIG. 4D, a resist 31 for forming posts are formed on the patterned wires 27, and only parts of the resist 31 that correspond to the metal posts 28 are removed.

Figure 5A:
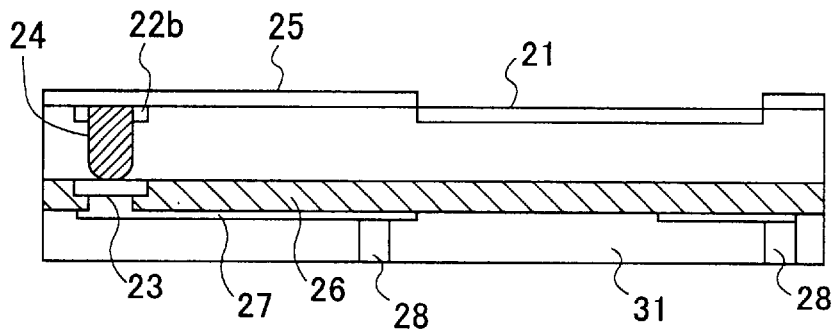
FIGS. 5A through 5D are cross-sectional views of the semiconductor device shown in FIG. 2 in the manufacturing process thereof.
Figure 5B:
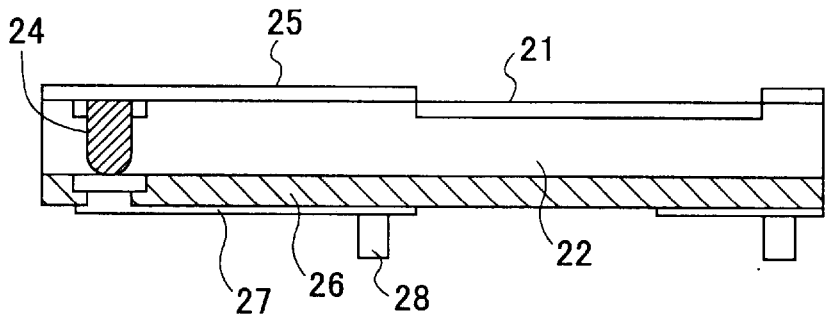
Figure 5C:
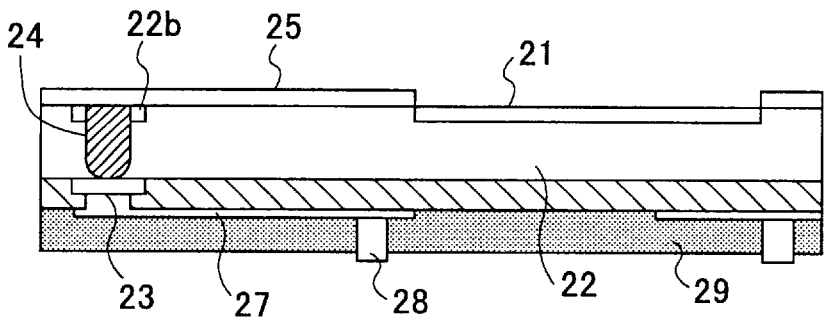
Figure 5D:
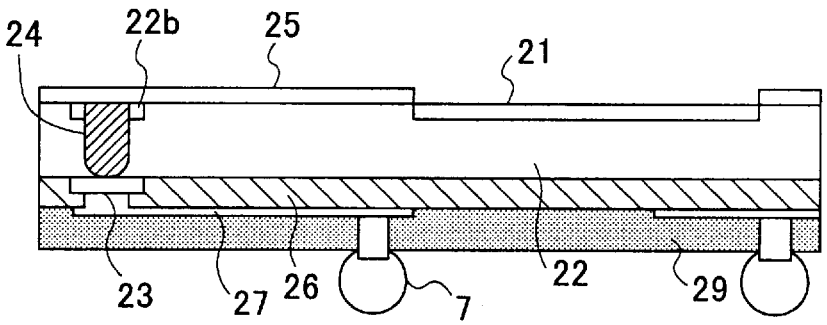

Then, copper plate is deposited in the parts where the resist 31 is removed so as to form the metal posts 28 as shown in FIG. 5A. After forming the metal posts 28, as shown in FIG. 5B, it becomes the state where the metal posts 28 extend from predetermined positions of the patterned wires 27 by removing the remaining parts of the resist 31. Then, the protective film 26 and the patterned wires 27 are encapsulated by a resin 29 which has an insulation and heat resistance. At this time, as shown in FIG. 5C, the encapsulation is carried out so that only the ends of the metal posts 28 are exposed. Finally, as shown in FIG. 5D, the solder balls 7 are formed on the ends of the metal posts 28 so as to be external connection terminals.

Although the description was made with reference to the steps for forming the single semiconductor device 20, the above-mentioned production process may be carried out in a state where a plurality of the semiconductor devices 20 are formed on a wafer. In this case, after forming the solder balls 7, a step of cutting the wafer so as to individualize each semiconductors apparatus 20 is needed.

As mentioned above, since the semiconductor apparatus 20 having the built-in fingerprint sensor according to the present embodiment does not have any members that protrude from the circuit forming surface 22a of the semiconductor chip 22, the protective film 25 can be made very thin. Therefore, the surrounding part of the fingerprint sensor 21 can be low, and a finger can be positively contacted to the exposed surface of the fingerprint sensor 21, thereby achieving reliable fingerprint recognition.

Figure 6:
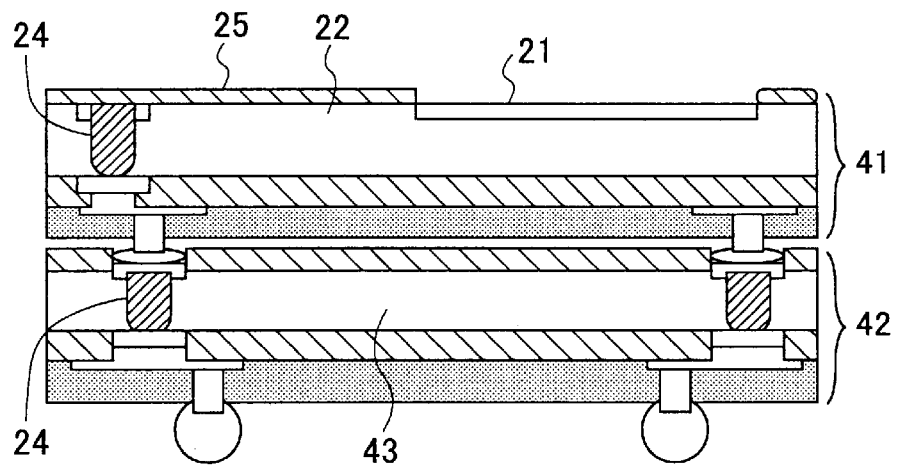
FIG. 6 is a cross-sectional view of a semiconductor device having a built-in fingerprint sensor according to a second embodiment of the present invention.

A description will now be given, with reference to FIG. 6, of a semiconductor apparatus having a built-in fingerprint sensor according to a second embodiment of the present invention. FIG. 6 is a cross-sectional view of the semiconductor device 40 having a built-in fingerprint sensor according to the second embodiment of the present invention. In FIG. 6, parts that are the same as the parts shown in FIG. 2 are give the same reference numerals, and descriptions thereof will be omitted.

The semiconductor device 40 according to the present embodiment has semiconductor chips that are stacked in two stages. An upper portion 41 on which an upper semiconductor chip 22 is provided has almost the same composition as the semiconductor device 20 shown in FIG. 2. In this case, the fingerprint sensor 21 and the circuit for attaining the function of the fingerprint sensor 21 are formed in the semiconductor chip 22. Additionally, a circuit and a memory for controlling the semiconductor chip 22 (sensor function) are formed in a semiconductor chip 43 provided in a lower portion 42.

The lower portion 42 has the same composition as fundamentally as the upper portion 41 (namely, semiconductor device 20 shown in FIG. 2), and can be produced by the same process. However, the semiconductor chip provided in the lower portion does not have the fingerprint sensor 21, and parts exposed from the protective film 25 are only the electrode parts.

As mentioned above, with the semiconductor device according to the present embodiment, the semiconductor chip which forms the fingerprint sensor 21 are produced separately from the semiconductor chip which has the circuit for controlling the semiconductor chip, and the semiconductor chips are stacked and unified so as to be a single semiconductor device. Generally, production processes differ considerably from a semiconductor chip having a sensor function (sensor part) to a semiconductor chip having a control function, and, thus, it is not an efficient way to combine these chips into a single semiconductor chip. As in the present embodiment, each semiconductor chip can be efficiently produced by producing a semiconductor chip having a sensor function (sensor part) and a semiconductor chip having a control function separately from each other. Moreover, by stacking the semiconductor chip 22 for sensor function and the semiconductor chip 43 for control function, the projected area of the semiconductor devices can be reduced, which contributes the miniaturization of the equipment into which the semiconductor device is incorporated.

Figure 7:
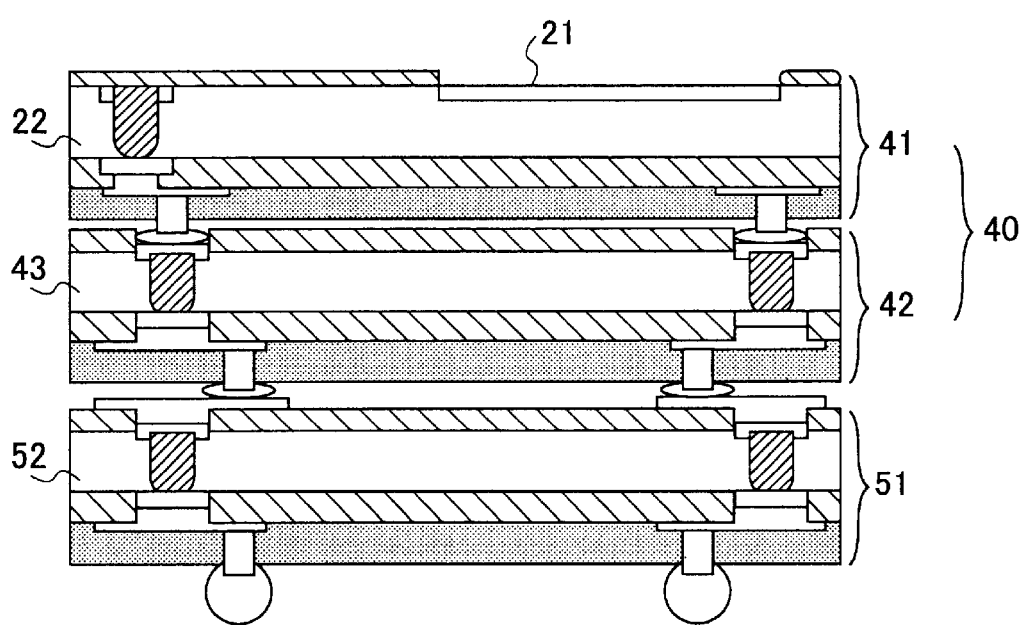
FIG. 7 is a cross-sectional view of a variation of the semiconductor device shown in FIG. 6.

It should be noted that, as shown in FIG. 7, another semiconductor chip may further be stacked. In the case of the semiconductor device shown in FIG. 7, the semiconductor chip 52 in the lowermost portion 51 is made as a chip exclusive for memory, the semiconductor chip 43 in the lower portion 42 is made as a chip for control circuit (logic operation), and the semiconductor chip 22 in the upper portion 41 is made as a chip exclusive for the sensor function.

Figure 8:
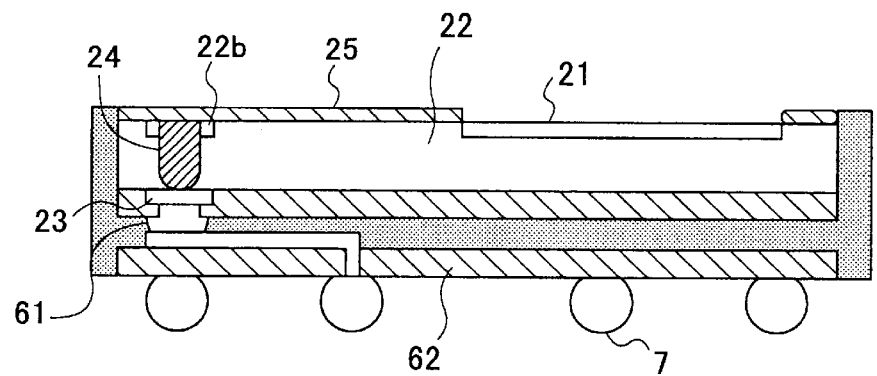
FIG. 8 is a cross-sectional view of a first variation of the semiconductor device shown in FIG. 2.

FIG. 8 is a cross-sectional view showing a first variation of the semiconductor apparatus 20 having a built-in fingerprint sensor shown in FIG. 2. In the first variation shown in FIG. 8, bumps 61 are formed on the back electrodes 23, and the semiconductor chip 22 is mounted on the package substrate 62 through the bumps. Then, the semiconductor chip is encapsulated by a resin on the package substrate 62, and the solder balls 7 are formed on the package substrate 62 as external connection terminals. Thereby, the semiconductor device having a built-in fingerprint sensor can be made as a BGA (ball grid array) type semiconductor device.

Figure 9:
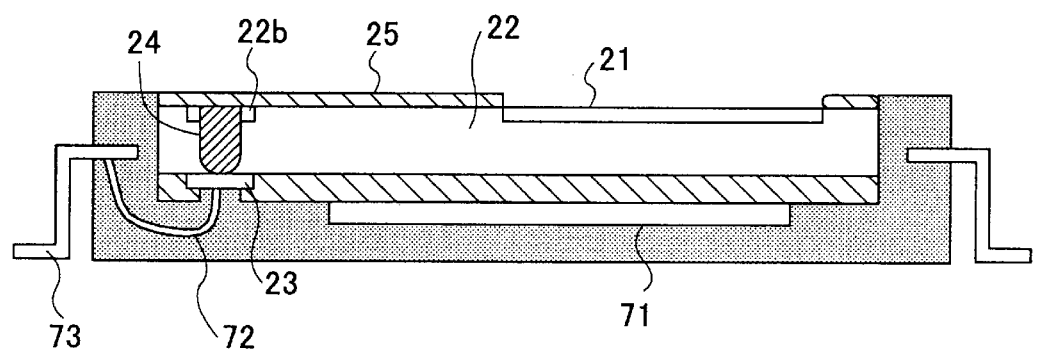
FIG. 9 is a cross-sectional view of a second variation of the semiconductor device shown in FIG. 2.

FIG. 9 is a cross-sectional view showing a second variation of the semiconductor device 20 having a built-in fingerprint sensor shown in FIG. 2. In the second variation shown in FIG. 9, the semiconductor chip 22 is mounted on a lead frame 71, and the back electrodes 23 are connected to the leads by bonding wires 72. Then, the lead frame 71, the bonding wires 72 and the semiconductor chip 22 are encapsulated by a seal resin so as to make the semiconductor device having a built-in fingerprint sensor as a so-called gull-wing type semiconductor device.

The present invention is not limited to the specifically disclosed embodiments, and variations and modifications may be made without departing from the scope of the present invention.

The present application is based on Japanese priority application No. 2002-079242 filed Mar. 20, 2002, the entire contents of which are hereby incorporated by reference.

What is claimed is:

1. A semiconductor device having a built-in contact-type sensor, comprising:
   a semiconductor element having a built-in sensor, the semiconductor element having a circuit forming surface and a back surface opposite to the circuit forming surface, the contact-type sensor and electrodes formed on the circuit forming surface, back electrodes formed on the back surface;
   conductive members extending through said semiconductor device from said electrodes to said back electrodes;
   a protective film covering said circuit forming surface in a state where a surface of said contact-type sensor is exposed; and
   external connection terminals electrically connected to said back electrodes.

2. The semiconductor device as claimed in claim 1, wherein said conductive members are formed by a conductive material filled in through holes.

3. The semiconductor device as claimed in claim 1, wherein an insulating protective film is formed on said back surface of said semiconductor element, and said back electrode and said external connection terminals are electrically connected to each other through patterned wires formed on the insulating protective film.

4. The semiconductor device as claimed in claim 1, further comprising a semiconductor element for control which provides a function related to a sensor function of said semiconductor element having the built-in sensor, wherein the control semiconductor element for control being situated on a backside of said semiconductor element having the built-in sensor.

5. The semiconductor device as claimed in claim 1, wherein a plurality of the semiconductor elements are provided which include the semiconductor elements for control which controls the sensor function of said semiconductor element having the built-in sensor and a semiconductor element for memory which stores data related to said sensor function.

6. The semiconductor device as claimed in claim 1, wherein said semiconductor element having the built-in sensor is encapsulated in a state where the semiconductor element is mounted on the package substrate via said back electrodes so that the semiconductor device is formed as a ball grid array type semiconductor device.

7. The semiconductor device as claimed in claim 1, wherein said semiconductor element having the built-in sensor is encapsulated in a state where the semiconductor element is mounted on a lead frame, and said back electrodes are electrically connected by bonding wires to lead terminals as said external connection terminals.

8. The semiconductor device as claimed in claim 1, wherein said contact-type sensor is a fingerprint sensor of an electrostatic capacitance type.

9. A manufacturing method of a semiconductor device having a built-in contact sensor, comprising the steps of:

preparing a semiconductor element having a built-in sensor, the semiconductor element having a circuit forming surface and a back surface opposite to the circuit forming surface, the contact-type sensor and electrodes formed on the circuit forming surface;

forming back electrodes on said back surface of said semiconductor element having the built-in sensor and forming through holes extending through said semiconductor element having the built-in sensor from said electrodes to said back electrodes;

electrically connecting said electrodes to said back electrodes by filling a conductive material in said through holes;

covering said circuit forming surface by a protective film in a state where a surface of said contact-type sensor is exposed; and forming external connection terminals on said back surface side so as to electrically connect the external connection terminals to said back electrodes.

10. The manufacturing method as claimed in claim 9, further comprising the steps of:

forming an insulating protective film on said back surface of said semiconductor element having the built-in sensor;

forming patterned wires on the insulating protective film; and forming said external connection terminals at predetermined positions of the patterned wires.

* * * * *